United States Patent [19]
Abe et al.

[11] Patent Number: 5,395,788
[45] Date of Patent: Mar. 7, 1995

[54] METHOD OF PRODUCING SEMICONDUCTOR SUBSTRATE

[75] Inventors: Takao Abe, Annaka; Yasuaki Nakazato; Atsuo Uchiyama, both of Koshoku, all of Japan

[73] Assignee: Shin Etsu Handotai Co., Ltd., Tokyo, Japan

[21] Appl. No.: 116,279

[22] Filed: Sep. 3, 1993

Related U.S. Application Data

[63] Continuation-in-part of Ser. No. 852,064, Mar. 16, 1992, Pat. No. 5,266,824.

[30] Foreign Application Priority Data

Mar. 15, 1991 [JP] Japan .................................. 3-074420

[51] Int. Cl.⁶ ............................................. H01L 21/76
[52] U.S. Cl. .................................... 437/61; 437/62; 437/974; 148/DIG. 12; 148/DIG. 150
[58] Field of Search ...................... 437/61, 62, 974; 148/DIG. 12, DIG. 150

[56] References Cited

U.S. PATENT DOCUMENTS

| | | | |
|---|---|---|---|
| 4,601,779 | 7/1986 | Abernathey et al. | 437/974 |
| 4,771,016 | 9/1988 | Bajor et al. | 437/974 |
| 4,851,078 | 7/1989 | Short et al. | 437/62 |
| 4,983,251 | 1/1991 | Haisma et al. | 148/DIG. 12 |
| 5,032,544 | 7/1991 | Ito et al. | 148/DIG. 12 |
| 5,086,011 | 2/1992 | Shiota | 148/DIG. 12 |
| 5,266,135 | 11/1993 | Short et al. | 437/62 |

FOREIGN PATENT DOCUMENTS 1226167 9/1989 Japan .................................. 437/974

OTHER PUBLICATIONS

Spangler et al., "A Technology for High-Performance Single-Crystal Silicon-on-Insulator Transistors"; IEEE Electron Device Letters, vol. EDL-8, No. 4, Apr. 1987, pp. 137-139.

Lemons et al., "Laser crystallization of Si films on glass", Appl. Phys. Lett. 40(6), Mar. 1982, pp. 469-471.

*Primary Examiner*—Brian E. Hearn
*Assistant Examiner*—Trung Dang
*Attorney, Agent, or Firm*—Evenson, McKeown, Edwards & Lenahan

[57] ABSTRACT

The present invention provides a method of making a semiconductor substrate having an SOI structure by temporarily bonding together two wafers having different thermal expansion coefficients to allow thinning of at least one of the wafers by chemical and/or mechanical treatment(s) to reduce the risk of strain, separation, cracks to the wafers followed by one or more heat treating steps to fully bond the wafers together. The method can produce semiconductor substrate having an SOI structure which can provide a silicon layer thin enough to allow various integrated circuits, or TFL-LCD or the like to be formed.

6 Claims, 4 Drawing Sheets

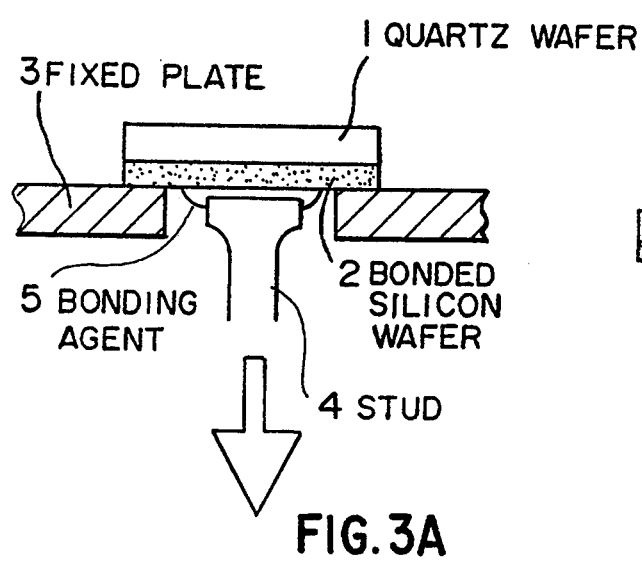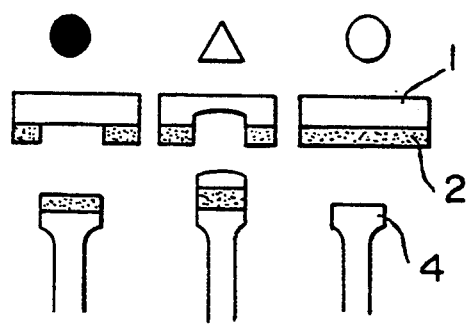
FIG. 3A
FIG. 3B

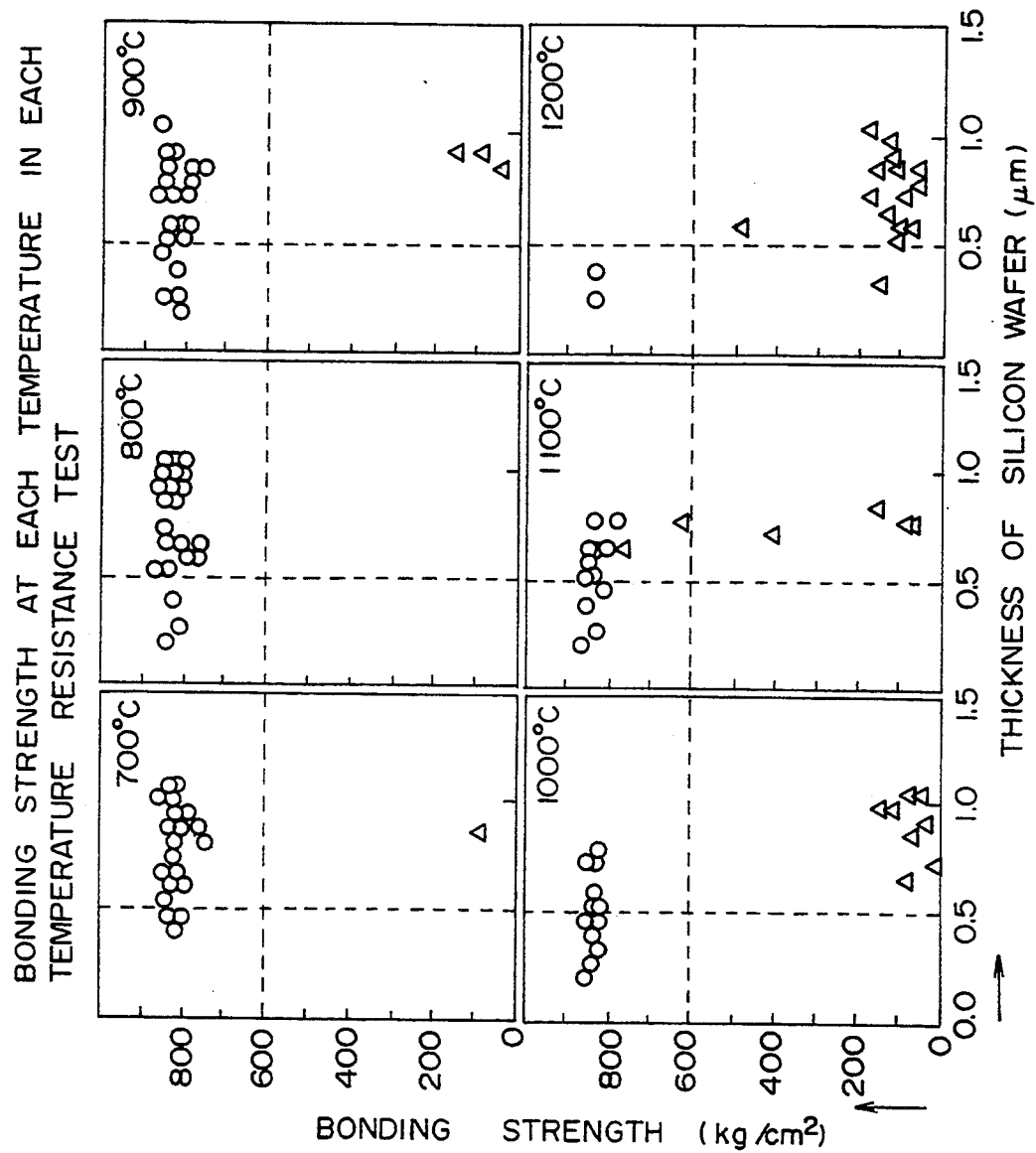

METHOD OF PRODUCING SEMICONDUCTOR SUBSTRATE

This is a continuation-in-part application of U.S. Ser. No. 07/852,064, filed on Mar. 16, 1992, now U.S. Pat. No. 5,266,824.

BACKGROUND OF THE INVENTION

1. Field of the Invention

The present invention relates to a method of producing a semiconductor substrate having an SOI structure (silicon On Insulator) formed by contacting two wafers integrally, which have different thermal expansion coefficients, and more particularly to a method of producing a semiconductor substrate having an SOI structure formed by heat bonding a single crystalline silicon wafer (hereafter referred as a silicon wafer) and a quartz wafer integrally.

2. Description of the Prior Art

Semiconductor substrates having an SOI structure formed by heat bonding two wafers integrally are quite advantageous as start-ins material for manufacturing integrated circuit devices. For example, in recent years these semiconductor substrates have been used widely as structural substrates for forming liquid crystal devices for HD televisions such as TFT transistors and their peripheral drives and control circuits.

Japanese Patent Application Publication (Koukoku Kohou) No. 13155/1975 discloses, for example, as a means of producing such semiconductor substrates having an SOI structure, a technique for heat bonding two silicon wafers firmly together by heating these two wafers in close contact therebetween at a high temperature (for example about 1,200° C.) under an oxidizing atmosphere.

When a silicon and a quartz wafer are brought in contact with each other, according to experiments conducted by the present inventors, it is observed that the wafers are joing together relatively strong even at room temperature without heat bonding, if the contact surfaces are polished and cleaned thoroughly. However, the adhesive strength between the bonded wafers is still insufficient if the outer surface of the silicon wafer is subsequently subjected to mechanical surface grinding to thin the silicon wafer.

It is further observed that heat treating the wafers results in stronger bonding, however, the heat treatment may cause thermal strain to occur in one of the wafers after the wafers are closely contacted together, or during cooling treatment after full heat bonding together of the wafers. Such temperature variations may cause cracking, or partial separation between the wafers, or the like, causing possible damage to the wafers due to differences in thermal expansion coefficients (i.e. the thermal expansion coefficient of silicon $=2.33 \times 10^{-6}$ verses the thermal expansion coefficient of quartz glass$=0.6 \times 10^{-6}$).

To obviate such disadvantages, there are existing suggested methods to form an amorphous silicon (a-Si) film directly on a glass substrate corresponding to a quartz wafer by vapor deposition, or other means instead of contacting two wafers as mentioned above. Another existing method includes forming a polycrystalline silicon film on a glass substrate, for example, by a CVD method. However, in such an amorphous silicon film or polycrystalline silicon film, the mobility of electrons in the substrate is greatly restricted and therefore the substrate is not satisfactorily suitable for HD televisions and extra-high frequency and extra-high luminance display devices to be developed in the future.

in addition to the restriction of the mobility of electrons in the substrate, there is a further technical limitation in the density of pins to be connected to external drive circuits making packaging quite difficult, particularly if TFT transistors are embedded in high density when forming TFT-LCD (thin-film transistor liquid crystal display), or the like, by applying multi-layer formation techniques such as a-Si film formation mentioned above.

On the other hand, when a single crystalline silicon wafer is used instead of an a-Si film formed on the glass substrate, the mobility of electrons can be increased in comparison with the case of the a-Si film. Thus, according to this method there will be no packaging problem, since the driving circuits can be integrally formed around the TFT region by heat bonding the polycrystalline silicon wafer onto the quartz glass plate (wafer). However, in the structural substrate for forming a TFT-LCD with single crystalline silicon wafers, the above-mentioned technical problem concerning differences in thermal expansion coefficients still remains unsolved.

OBJECTS OF THE INVENTION

The present invention was created to overcome the above-described conventional technical problems.

An object of the present invention is to provide an improved method of producing a semiconductor substrate having an SOI structure by bonding two wafers together having different thermal expansion coefficients (e.g., a silicon wafer and a quartz wafer) by heat treatment while eliminating the risk that the semiconductor substrate will be thermally damaged by thermal strain, cracks, or partial separation due to differences in the thermal expansion coefficients of the wafers.

Another object of the present invention is to provide a method of producing the above-mentioned semiconductor substrate with a SOI structure and having a thin silicon layer that can be easily obtained to produce various well formed integrated circuits or TFT-LCD, or the like.

SUMMARY OF THE INVENTION

Generally, when a silicon wafer and a quartz wafer whose surfaces have been polished and cleaned are brought in contact with each other, they can be held together to a certain degree even at room temperature. However, such adhesive strength between the wafers at room temperature is insufficient to withstand surface grinding of the silicon wafer for making it thin, as described above. Further, if the thickness of the wafers is in the order of 500 to 600 $\mu m$, high-temperature heat treatment which is required for obtaining sufficient bonding strength that can withstand surface grinding of the silicon wafer is impossible due to thermal expansion as explained above.

It is usually seen that the average thickness of an existing silicon wafer and quartz wafer are 500 to 800 $\mu m$. In the present invention, however, a silicon wafer processed to 300 $\mu m$ in advance is further processed to be made thinner than 10 $\mu m$, and finally to less than 1 $\mu m$ while the base substrate (e.g. quartz wafer) is maintained a substantial thickness to provide sufficient structural strength of the assembly.

Generally, when these wafers are brought in contact with each other the wafers are temporarily held together by a certain adhesive strength therebetween. However, heat treating is still required to cause heat bonding to increase the bonding strength between the wafers and stabilize the assembly for further processing.

According to our investigation, it is observed that the disadvantage caused by differences in thermal expansion coefficients is not serious when heat treating in the temperature range between 100° to 350 ° C., and thus a temporarily bonded substrate can be obtain which has a stronger adhesive strength than obtainable at room temperature. It is, however, necessary to conduct the thinning process by chemical treatment, such as chemical etching with an aqueous alkali solution, since the adhesive strength between the wafers is not sufficient to allow surface girding of the silicon wafer.

However, chemical treatment for thinning the silicon wafer is not an efficient process, and it is difficult to process the thickness of the wafer evenly. Therefore, it is desirable to apply surface grinding and polishing of the substrate as a next processing step for further thinning the silicon wafer, however, this step requires higher temperature heat treatment and a substrate than can withstand such a heat treatment step.

A further investigation was done to overcome this disadvantage, and it was found that the thinner one of the wafers (in this case, silicon wafer), the less disadvantages occurred due to differences in the thermal expansion coefficients, thus allowing higher temperature heat treatment to achieve a more stable fully bonded substrate. It was also found that incrementally increasing the heat treatment temperature and repeating the cycles of the thinning process after each incremental increase in heat treatment temperature provided an even greater advantage to prevent damage resulting from differences in thermal coefficients.

The method of producing a semiconductor substrate having an SOI structure according to the present invention, involves heat bonding two wafers having different thermal expansion coefficients. The method comprises a first step of heat treating the two wafers, which have been previously abraded and cleaned, in a first temperature range with the surfaces of the wafers pressed together thereby forming a temporarily adhered substrate, and a second step of thinning at least one of the wafers of the temporarily bonded substrate by chemical treatment, subjecting the temporarily bonded substrate to heat treatment in a second temperature range, which is higher than the first temperature range thereby allowing the temporarily bonded substrate to become a fully bonded substrate.

The method of producing a semiconductor substrate having an SOI structure according to the present invention is further characterized in that the thinning of the surface of one of the wafers of the temporarily, bonded substrate is carried out by chemical etching with an aqueous alkali solution.

In another embodiment, the method of producing the semiconductor substrate includes additional cyclic steps including a thinning process by chemical or mechanical treatment to one side of the wafer, and a heating process in an incrementally higher temperature range in order to prevent damage of the wafer surface due to differences in thermal expansion coefficients.

The method of producing a semiconductor substrate having an SOI structure according to the present invention is further characterized by using silicon and quartz wafers having a prescribed thickness and different thermal expansion coefficients, including a first step of a heat-treating process in a first temperature range of about 100° to 350 ° C. for wafers that have been placed in contact and previously at least abraded and cleaned prior to being pressed together, thereby forming a temporarily bonded substrate, and a second step of, making at least the silicon wafer surface of the temporarily bonded substrate thinner by chemical treatment to cause the surface to have a thickness of about 100 to 200 $\mu$m, and thereafter applying heat treatment to the bonded substrate in a second temperature range having about 350° to 500 ° C. to form a fully bonded substrate. A semiconductor substrate produced by this method can be utilized for producing TFT-LCD, which require relatively low temperature range type heat treatment.

The method of producing a semiconductor substrate having an SOI structure according to the present invention is further characterized, in order to prevent from the thermal damage in one of the wafer surface due to the different thermal expansion coefficients, a third step of making the above silicon wafer of the fully bonded substrate thinner to cause the silicon wafer to have a thickness of about 2 $\mu$m, and thereafter applying a third heat treatment to the fully bonded substrate in a third temperature range of about 500° to 700 ° C., and a final step of making the above silicon wafer surface of the fully bonded substrate still thinner to cause the surface to have a thickness of less than about 1 $\mu$m, and thereafter applying one or more final heat treatments to the fully bonded substrate in a fourth temperature range having a temperature of more than 800° C., but not more than 1,200° C.

The reason for limiting the heating temperature under 1,200° C. is that the quartz wafer is likely to turn soft at temperatures above 1,200° C., and the usual temperature requirements for producing most semiconductor devices are under this temperature range and the warranty for such semiconductor substrates is limited to under 1,200°C.

According to the present invention, therefore, it is technically possible to process the fully bonded substrate to be less than 2 $\mu$m, preferably less than 1 $\mu$m, and most preferably less than 0.5 $\mu$m, thereby achieving a stable bonding (i.e. quality) strength specially when it is used in semiconductor devices produced in the temperature range of 800°–1200° C. The method according to the present invention will also enable stronger bonding between the thin silicon wafer and the quartz wafer, thereby eliminating the risks of thermal strain, cracks, or partial separation due to thermal expansion, and stabilizing the quality of the semiconductor substrate.

Therefore, the present invention meets the technical trend of thinning the wafer of SOI structure, and meets any of the high temperature processing requirements of current semiconductor producers. This advantage will also meet the requirement of ultra high brilliant TFT-LCD used, for example, in HD television, and the requirements of semiconductors for use in high speed optical/electrical devices using crystal substrate as a wave guide, which may replace the aluminum conductor used in the next generation LSI.

BRIEF DESCRIPTION OF THE DRAWINGS

FIG. 3 (A) is a diagram of the bonding test for determining bonding strength of the bonded substrate of thin silicon and quartz wafers;

FIG. 3 (B) are cross-sectional views of broken sections resulting from the bonding test depicted in FIG. 3 (A) showing three different modes of separation between wafers; and FIG. 4 is a graph showing the relationship between each thickness of the thinned silicon wafer in the second embodiment and the bonding strength after the temperature resistance test at different temperature parameters.

DETAILED DESCRIPTION OF THE INVENTION

The method of producing semiconductor substrate according to the embodiments of the present invention will be described in detail.

It is, however, not intended to limit the scope of the present invention to the experimental conditions, the dimensions and materials of the samples, etc., in the example, but it is merely aimed to an illustrative purpose, unless otherwise specified.

The First Embodiment

Figure 1:
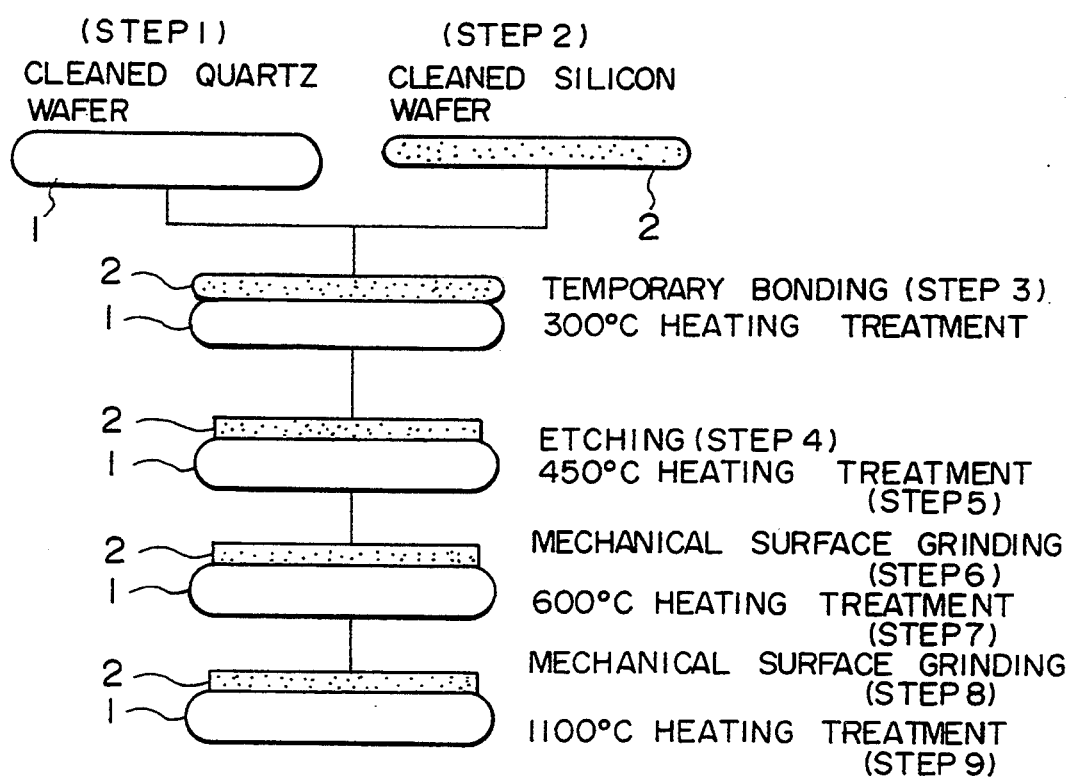
FIG. 1 is a diagram of the process of making semiconductor substrates having SOI structure according to the present invention.

The first embodiment of the present invention will be explained in detail with the reference of FIG. 1.

In this first embodiment, a base wafer 1, for example, a quartz wafer circular in shape and having a diameter of 100 mm and a thickness of 550 $\mu$m is polished by abrading, and the surface to be heat bonded is cleaned by carrying out a primary cleaning and a secondary cleaning (step 1).

Another wafer 2, for example, a silicon wafer 2 circular in shape and having a diameter of 100 mm and a thickness of 550 $\mu$m is made thin by mechanical surface grinding so that the wafer has a thickness of 300 $\mu$m. The surface is finished by mechanical polishing so that the surface roughness is in the order of about 5 nm in terms of peak to valley variation of surface irregularity, and the thickness of the silicon wafer is approximately brought to 285 $\mu$m. The surface to be bonded is cleaned by carrying out a primary cleaning and a secondary cleaning, as mentioned above with respect to wafer 1.

In the cleaning operations, particularly the secondary cleaning operation, if the cleaning means used to clean the wafer 2 is different from that used to clean the base wafer 1, there is a risk that the subsequent bonding together of the wafers will not be smoothly carried out because the surface states of the wafers may be different. Thus, in this embodiment the final secondary cleaning for both wafers is provided with a cleaning liquid of HCl/H$_2$O$_2$ (step 2).

The wafers are then pressed together and loaded in a thermostatic chamber, and heat-treated at a temperature range of about 100° to 350° C. for at least one hour, more specifically at a constant temperature of 300° C. for 2 hours, thereby forming a temporarily heat bonded substrate (step 3).

The silicon wafer 2 of the thus obtained temporarily heat bonded substrate is etched with an aqueous alkali solution so the thickness of the silicon wafer is reduced from 285 $\mu$m to 135 $\mu$m, and then washed to remove completely the alkali and other components of the alkali solution used in the etching process (step 4).

The silicon wafer 2 of the temporarily heat bonded substrate after being thinned is heat-treated at a temperature of 450° C. in a oxygen gas atmosphere to fully heat bond the wafers together. The bonding strength between the wafers is sufficient to allow the substrate to be subjected to surface grinding to make the silicon wafer thinner. The bonding strength is about 800 kg/cm$^2$ on average (step 5).

The silicon wafer 2 of the fully bonded substrate described above is subjected to surface grinding to reduce the thickness from 135 $\mu$m to 20 $\mu$m in order to evaluate the bonding quality (step 6.1).

The experimental results reveal that no partial separation or cracks is observed due to above described surface grinding (step 6.1).

The thinned substrate mentioned above is then subject to the temperature resistance test in a plurality of temperature ranges of over 600° C. for 2 hours, in order to examine the stability of the bonded boundary.

Figure 2:
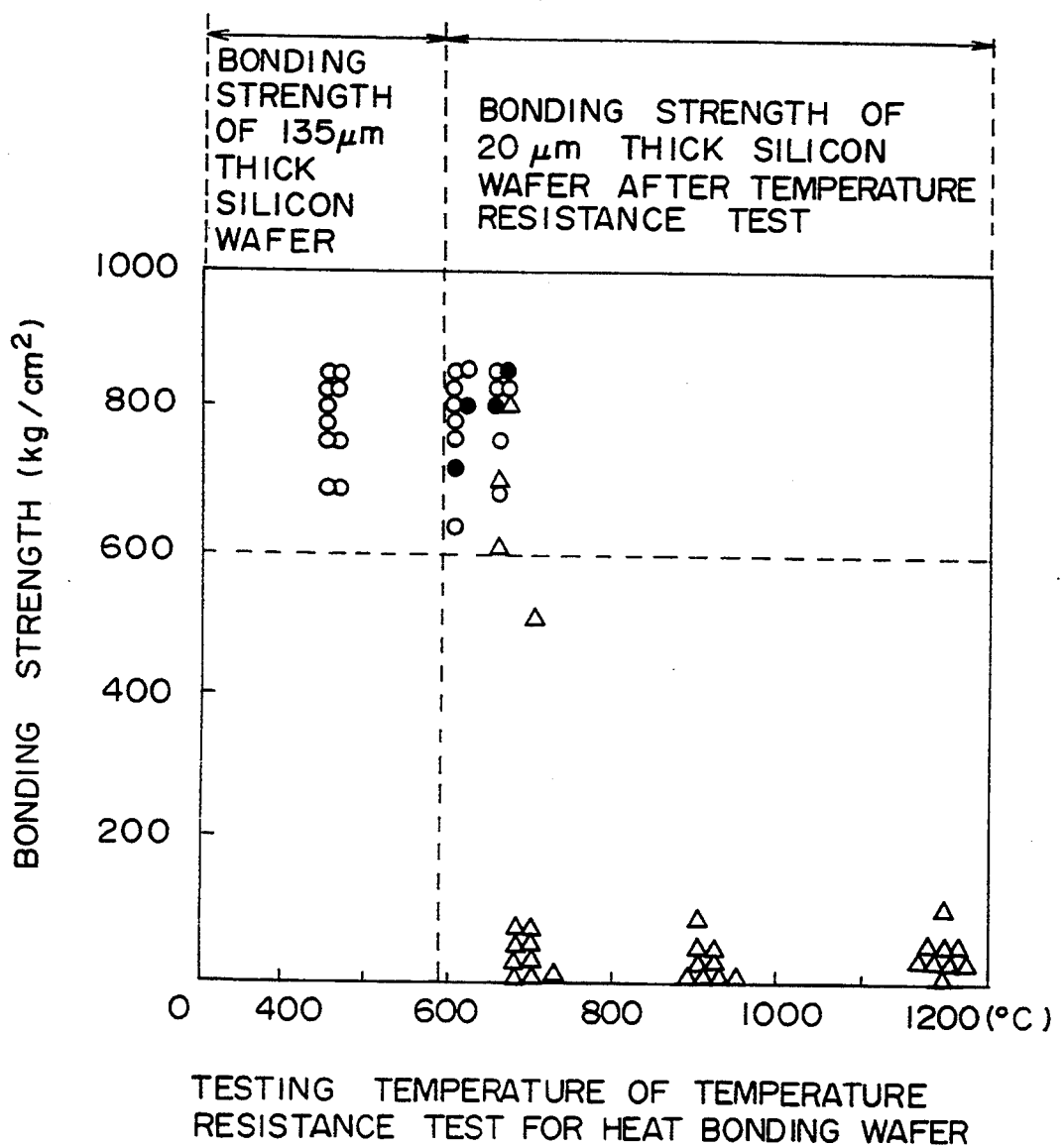
FIG. 2 is a graph showing bonding strength at two heat treating temperatures in the first embodiment, and bonding strength at each testing temperature during a temperature resistance test.

In the graph shown in FIG. 2, the values shown near 450° C. indicate the bonding strength after the heat treatment at 450° C. The values shown just over 600° C. indicate the bonding strength of the substrates that were heat treated at 450° C. mentioned above and with silicon wafer 2 reduced to a thickness of 2 to 20 $\mu$m.

Ten (10) samples were tested and measured with the values plotted in the graph shown in FIG. 2. The experimental results reveal that the bonding strength of the fully heat bonded substrate is substantially lowered when the fully bonded substrate is heated at 700° C. for 2 hours.

This substantial decrease in bonding strength can be attributed to by the occurrence of cracks or partial separations at the bonded boundary between the silicon wafer and the quartz wafer due to their different thermal expansion coefficients.

The silicon wafer 2 of the fully heat bonded substrate formed by heat treatment at a temperature of 450° C., is subjected to mechanical surface grinding to reduce the thickness from 135 $\mu$m to 20 $\mu$m. After this process, it is subsequently selectively etched on the periphery thereof to make it approximately round except for some possible surface protrusions followed by polishing by abrading the silicon wafer 2 to reduce the average thickness thereof from 20 $\mu$m to approximate 2 $\mu$m evenly (step 6.2).

In this process, the bonding status of the silicon wafer 2 remains stable, and then the silicon wafer 2 is subjected to heat treatment at 600° C. for 2 hours (step 7). The bonding test was conducted at twenty (20) different spots on the substrate. The experiments confirmed that a substantially thin silicon wafer had a stronger bonding strength of over 700 kg/cm$^2$, which was more than expected, and no partial separation was observed at the bonding boundary.

It is our intention to apply this final heating treating to the bonded substrate in order to obtain not only the stronger bonding strength, but also more stable quality against heat process which will be applied under this heat process (600° C.).

The semiconductors produced by the method mentioned above will be suitable to produce a TFT-LCD, which requires relatively low heat treatment according to today's standard.

In the bonding tests described above, a Sebastian Model V was used as the stretching device.

FIG. 3 (A) shows the outline of operation of the bonding test. The silicon wafer 2 bonded to quartz wafer 1 is placed on the fixed plate 3, and then is cut to the size of 7×7 mm² which is the same size as stud 4. After cutting to size, the bonded wafers are fixed on the stud 4 by adhesive, and then the bonding test is conducted.

FIG. 3 (B) shows the results of the bonding test. An open circle mark indicates a clean separation between the wafers and stud 4 (i.e. good bonding strength between wafers). An open triangle mark indicates the same results as the open circle mark, except some damage occuring to just the quartz wafer 1. A solid black circle mark indicates incomplete bonding between the wafers.

Second Embodiment

According to the steps in the first embodiment, six (6) pieces of round semiconductor substrate having 100 mm diameter, 550 μm thick quartz wafer 1, and an approximately 2 μm evenly thick silicon wafer was applied with heat treatment for 2 hours at 600° C. were produced (as mentioned at step 7).

The silicon wafers are further ground to a range of approximately 0.5 to 1.5 μm in thickness by flat grounding (Step 8.1). No cracks or partial separations are observed at the bonding boundary.

Then these six (6) pieces of substrate are respectively subjected to the temperature resistance test at temperatures of 700° C., 800° C., 900° C., 1000° C., 1100° C., 1200° C., respectively. These substrates are thereafter subjected to the bonding test for evaluation of their bonding strength.

The test was conducted after measuring the thickness of the thinned silicon wafers. This measuring was done by differentiation interference microscope (Nanospec).

Twenty (20) to thirty (30) different parts of each substrates having different thicknesses were sampled for the bonding test, and the test results are shown in FIG. 4.

As shown clearly in the results, it is revealed the most notable differences between the samples formed according to the first and second embodiments. In the first embodiment, the bonding strength of the 20 μm thick silicon wafer has notably lowered at the resisting temperature test against heating at 700° C. for 2 hours, where in the second embodiment, the substrate thinner than 0.6 μm silicon maintains the stable bonding strength even at a temperature of 1,100° C., without thermal strain, cracks, or partial separation due to differences in the thermal expansion coefficients.

Specifically observing, the substrate thickness of more than 0.6 μm thick silicon lowered the bonding strength sharply at 1,000° C. in the temperature resistance test, but maintained the adequate bonding strength at 900° C. If the thickness of silicon is thicker than approximate 1 μm, the substrate lowered bonding strength sharply at 900° C., but maintained adequate bonding strength at 800° C.

The substrates made according to the first embodiment (step 7), hereafter are produced and ground to a range of approximately 0.4 to 0.6 μm (step 8.2), then subjected to the temperature resistance test at 1,100° C. for 2 hours (step 9). Twenty (20) different parts of the substrates were sampled for the bonding test, and the test results are that all the samples indicate a high bonding strength of 700 kg/cm², which exceeds the target value without partial separation at the bonding boundary.

This fact is very important in practical use, because the substrates produced according to the second embodiment will expand the range of use of the semiconductor elements subjected to heat in the temperature range of 800° to 1,200° C.

This fact is also important, because it is necessary in the semiconductor producing process to have stability against heat treating without causing any thermal strain, cracks, and partial separations due to differences in the thermal expansion coefficients.

This technology can satisfy the present technical trend of seeking thinner wafers of SOI structure, and also meet the requirements of higher temperature heat treatments of semiconductor devices by manufacturers. It will further make possible the application of this type of semiconductor for making higher capability TFT-LCD, and optical/electical devices, which is expected as a next generation LSI.

What is claimed is:

1. A method of producing a semiconductor substrate formed by bonding two wafers having different thermal expansion coefficients together, comprising the steps of:
    polishing and cleaning surfaces of said two wafers to be bonded together;
    placing said two wafers in contact each other;
    applying heat treatment to said two wafers in a first temperature range thereby forming a temporarily heat bonded substrate;
    thinning at least one of said two wafers by chemical treatment; and
    applying heat treatment to said temporarily heat bonded substrate in a second temperature range higher than said first temperature range, thereby forming a fully heat bonded substrate.

2. A method of producing a semiconductor substrate according to claim 1, wherein thinning of at least one of said two wafers is carried out by chemical etching with an aqueous alkali solution.

3. A method of producing a semiconductor substrate according to claim 1, further comprising at least one cycle of steps comprising:
    further thinning said fully heat bonded semiconductor substrate; and
    further applying heat treatment to said further thinned fully heat bonded semiconductor substrate in a third temperature range incrementally higher than said second temperature range.

4. A method of producing a semiconductor substrate according to claim 1, wherein:
    said two wafers having different thermal expansion coefficients are made of silicon and quartz, respectively, having prescribed thicknesses;
    said first temperature range is approximately 100° to 350° C.;
    said silicon wafer thickness is thinned to approximately 100 to 200 μm by said chemical treatment; and
    said second temperature range is approximately 350° to 500° C.

5. A method of producing a semiconductor substrate according to claim 4, further comprising;
    further thinning said silicon wafer to approximately 2 μm; and
    applying said heat treatment in said third temperature range of approximately 500° to 700° C.

6. A method of producing a semiconductor substrate according to claim 5, further comprising the steps of:
    further thinning said silicone wafer to approximately less than 1 μm; and
    applying heat treatment incrementally in a fourth temperature range between 800° C. and 1,200° C.

* * * * *